US008435875B1

(12) United States Patent
Chang et al.

(10) Patent No.: US 8,435,875 B1
(45) Date of Patent: May 7, 2013

(54) METHOD FOR FORMING T-SHAPED GATE STRUCTURE

(75) Inventors: Edward Yi Chang, Hsinchu County (TW); Lu-Che Huang, New Taipei (TW); Chia-Hua Chang, Taichung (TW); Yueh-Chin Lin, New Taipei (TW); Wei-Hua Chieng, Hsinchu (TW); Shih-Chien Liu, Hsinchu (TW)

(73) Assignee: National Chiao Tung University, Hsinchu (TW)

( * ) Notice: Subject to any disclaimer, the term of this patent is extended or adjusted under 35 U.S.C. 154(b) by 0 days.

(21) Appl. No.: 13/489,476

(22) Filed: Jun. 6, 2012

(30) Foreign Application Priority Data

Jan. 11, 2012 (TW) ............................. 101101109 A

(51) Int. Cl.
*H01L 21/336* (2006.01)
(52) U.S. Cl.
USPC .................................. 438/585; 257/E21.409
(58) Field of Classification Search .................. None
See application file for complete search history.

(56) References Cited

U.S. PATENT DOCUMENTS

| 4,587,138 A * | 5/1986 | Yau et al. ...................... 438/660 |
| 4,963,501 A * | 10/1990 | Ryan et al. .................... 438/183 |
| 2002/0155665 A1 * | 10/2002 | Doris et al. .................... 438/279 |
| 2009/0159930 A1 * | 6/2009 | Smorchkova et al. ......... 257/194 |
| 2009/0206369 A1 * | 8/2009 | Dang et al. .................... 257/194 |
| 2010/0184262 A1 * | 7/2010 | Smorchkova et al. ......... 438/172 |

FOREIGN PATENT DOCUMENTS

TW 248610 6/1995

OTHER PUBLICATIONS

Submission T-Shaped Gate HEMT Fabrication Using Deep-UV Lithography.

* cited by examiner

*Primary Examiner* — Seahvosh Nikmanesh
(74) *Attorney, Agent, or Firm* — CKC & Partners Co., Ltd.

(57) ABSTRACT

A method for forming a T-shaped gate is provided. The method includes providing a substrate. Then, a photoresist structure is formed over the substrate. The photoresist structure includes two development rates. Next, a mask with an opening is formed over the photoresist structure to pattern the photoresist structure. An angle exposure is applied to the photoresist structure, and the exposed photoresist structure is developed to form a T-shaped notch. A width of the T-shaped notch is gradually reduced from a top portion thereof to a bottom portion to expose a surface of the substrate. Then, a gate metal is deposited in the T-shaped notch. Thereafter, the patterned photoresist structure is removed to form the T-shaped gate.

10 Claims, 4 Drawing Sheets

METHOD FOR FORMING T-SHAPED GATE STRUCTURE

RELATED APPLICATIONS

This application claims priority to Taiwan Application Serial Number 101101109, filed Jan. 11, 2012, which is herein incorporated by reference.

BACKGROUND

1. Field of Invention

The present invention relates to a method for forming a gate structure, and more particularly to a method for forming a T-shaped gate structure.

2. Description of Related Art

A GaAs device tends to have less noise than a silicon device, especially at a high frequency resulting in higher carrier mobilities and lower resistive device parasitics. These properties recommend applying a GaAs circuitry in a mobile phone, satellite communication, a microwave point-to-point link and a higher frequency radar system.

To reduce a gate length without increasing a gate resistance, a T-shaped gate structure is commonly used. The T-shaped gate is composed of an upper wide layer which increases a cross sectional area of the gate for reducing the gate resistance, and a small footprint with a reduced gate capacitance. In general, the T-shaped gate is fabricated using e-beam lithography. It is a reliable technology because the resolution of e-beam lithography can be very high. However, it also has a very low throughput which limits its applications on mass production.

Therefore, a new T-shaped gate manufacturing method is needed.

SUMMARY

An object of the present invention is to provide a method for forming a T-shaped gate structure.

The present invention provides a method for forming a T-shaped gate. The method includes providing a substrate. Then, a photoresist structure is to formed over the substrate. The photoresist structure includes two development rates. Next, a mask is formed over the photoresist structure. The mask has an opening. The mask is used to pattern the photoresist structure. An angle exposure is applied to the photoresist structure, and the exposed photoresist structure is developed to form a T-shaped notch. A width of the T-shaped notch is gradually reduced from a top portion to a bottom portion to expose a surface of the substrate. Then, a gate metal is deposited in the T-shaped notch. Thereafter, the patterned photoresist structure is removed to form the T-shaped gate.

In an embodiment, a lift-off process is performed to remove the photoresist structure.

In an embodiment, the height of the photoresist is 1 um and the width of the opening is 2 um.

In an embodiment, the step of applying an angle exposure to the photoresist structure further comprises: applying a first angle exposure to the photoresist structure; and applying a second angle exposure to the photoresist structure, wherein the first angle exposure and the second angle exposure are applied from opposite sides. The first angle exposure and the second angle exposure are applied to the photoresist structure at an angle between 25 degrees to 65 degrees relative to the substrate.

In an embodiment, the mask is formed from Ti, NI, AU, Al or Cu.

In an embodiment, the step of forming the photoresist structure over the substrate further comprises: forming a first photoresist layer in the substrate; forming a second photoresist layer over the first photoresist layer; and forming a third photoresist layer over the second photoresist layer, wherein, when being compared with the second photoresist layer, the first photoresist layer and the third photoresist layer have lower development rates. The material forming the first photoresist layer and the third photoresist layer is Polymethyl methacrylate (PMMA), and the material forming the second photoresist layer is Polymethyl isopropenyl ketone (PMIPK) or Copolymer.

In an embodiment, the T-shaped gate includes Ni/Au bilayers, wherein the thickness of the Ni layer is 200 angstrom and the thickness of the Au layer is 3000 angstrom.

The present invention applies an angle exposure method to a tri-layer photoresist structure with different development rates. Because of the different development rate of the tri-layer photoresist structure, a T-shaped notch is developed in the substrate after a development process is performed. Moreover, an improved top to bottom width ratio of the T-shaped gate can be also achieved by the angle exposure method.

BRIEF DESCRIPTION OF THE DRAWINGS

In order to make the foregoing as well as other aspects, features, advantages, and embodiments of the present invention more apparent, the accompanying drawings are described as follows.

DETAILED DESCRIPTION

Figure 1:
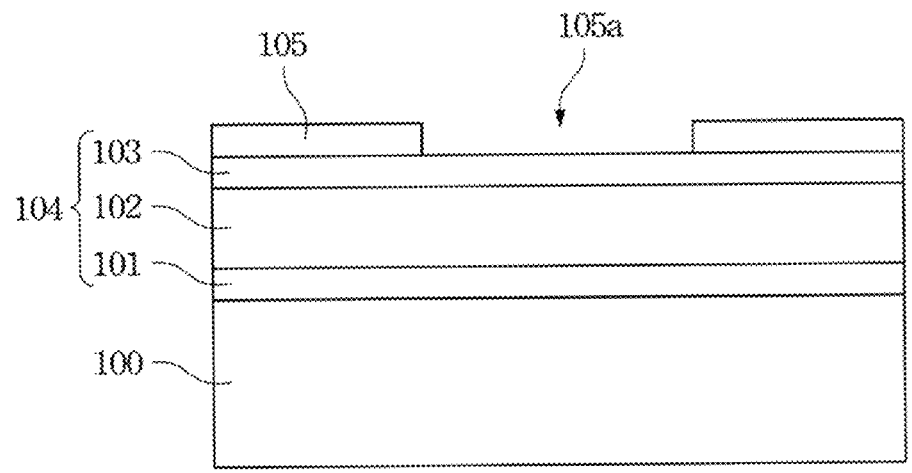
FIG. 1 to FIG. 6 illustrate a method for forming a T-shaped gate according to an embodiment.

Reference will now be made in detail to the present embodiments of the invention, examples of which are illustrated in the accompanying drawings. Wherever possible, the same reference numbers are used in the drawings and the description to refer to the same or like parts.

Two photoresists with different development rates are used to form a T-shaped gate. According to the present invention, a tri-layer photoresist structure is formed in a substrate. In an embodiment, a first photoresist layer is formed in the substrate. A second photoresist layer that has a higher development rate than the first photoresist layer is formed in the first photoresist layer. A third photoresist layer that has a lower development rate than the second photoresist layer is formed in the second photoresist layer. Then, an angle exposure method is applied in the tri-layer photoresist structure. Because of the different development rate of the tri-layer photoresist structure, a T-shaped notch is developed in the substrate after development process is performed. Then, a gate metal is deposited in the T-shaped notch by electron beam evaporation. Finally, the remaining photoresists and undesired metals are removed to form the T-shaped gate.

FIG. 1 to FIG. 6 illustrate a method for forming a T-shaped gate according to an embodiment. As illustrated in FIG. 1, a first photoresist layer 101, a second photoresist layer 102 and a third photoresist layer 103 are sequentially deposited in a substrate 100 to form a tri-layer photoresist structure 104. A metal layer 105 is deposited in the tri-layer photoresist structure 104. A photolithography process is applied on the metal layer 105 to form a through hole 105a. The hole 105a defines the position of the T-shaped gate in the substrate 100. In an embodiment, the width of the hole 105a is 2 um. The material forming the metal layer 105 is Ti. In another embodiment, the material forming the metal layer 105 is Ni, Au, Al or Cu. A wet-etching method is used to form the hole 105a. Moreover, when being compared with the second photoresist layer 102, the first photoresist layer 101 and the third photoresist layer 103 have lower development rates. In an embodiment, the material forming the first photoresist layer 101 and the third photoresist layer 103 is Polymethyl methacrylate (PMMA). The material forming the second photoresist layer 102 is Polymethyl isopropenyl ketone (PMIPK) or Copolymer. That is, the tri-layer photoresist structure 104 is PMMA/PMIPK/PMMA or PMMA/Copolymer/PMMA. In an embodiment, the height of the tri-layer photoresist structure 104 is 1 um.

Figure 2:
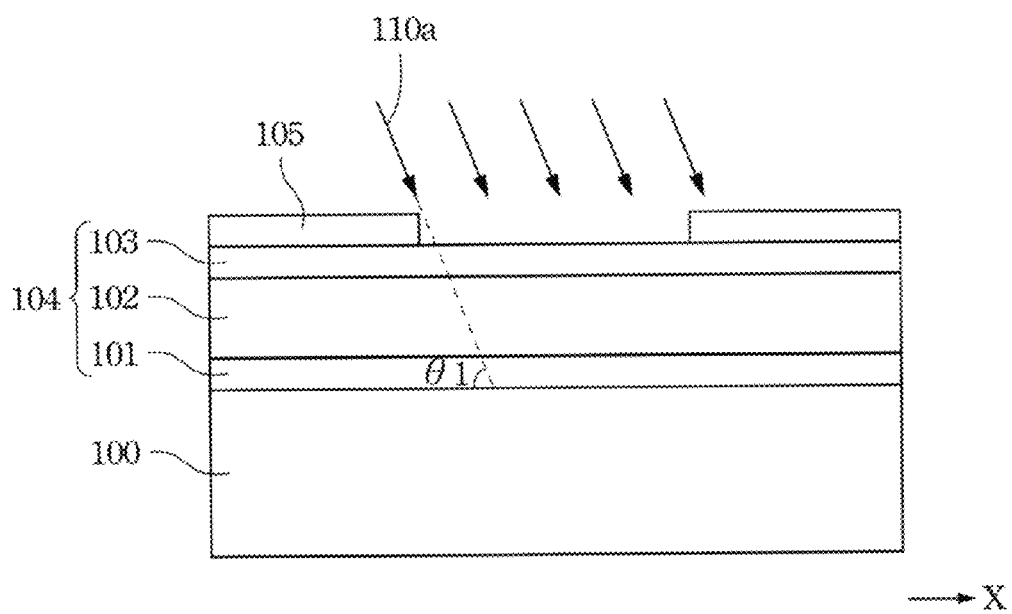
Figure 4:
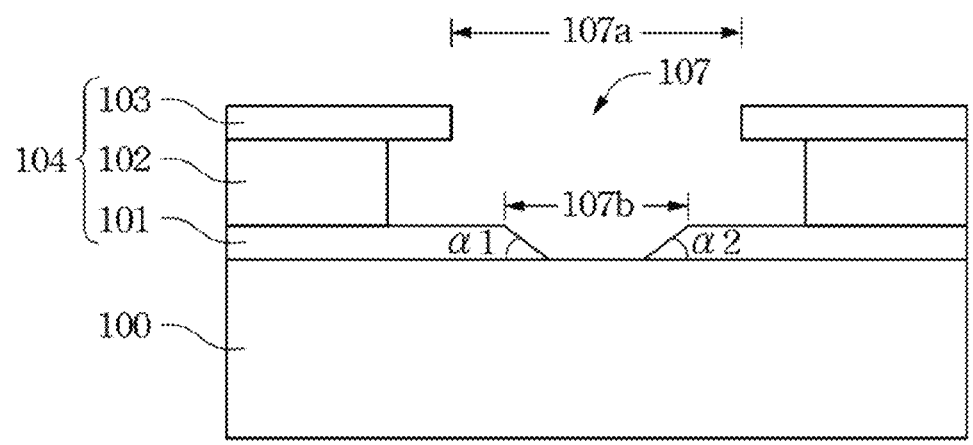

In FIG. 2, the metal layer 105 acts as a photomask for the following first angle exposures process. First UV light 110a illuminates the tri-layer photoresist structure 104 to pattern the tri-layer photoresist structure 104. An included angle $\theta 1$ exists between the first UV light 110a and the substrate 100. The included angle $\theta 1$ can control the depressed depth of the second photoresist 102 relatively to the first photoresist layer 101 in the positive X direction. The included angle $\theta 1$ also decides an inclination angle $\alpha 1$ of a slant sidewall formed by the first photoresist layer 101 as illustrated in FIG. 4. In an embodiment; the included angle $\theta 1$ is between 25 degrees to 65 degrees.

Figure 3:
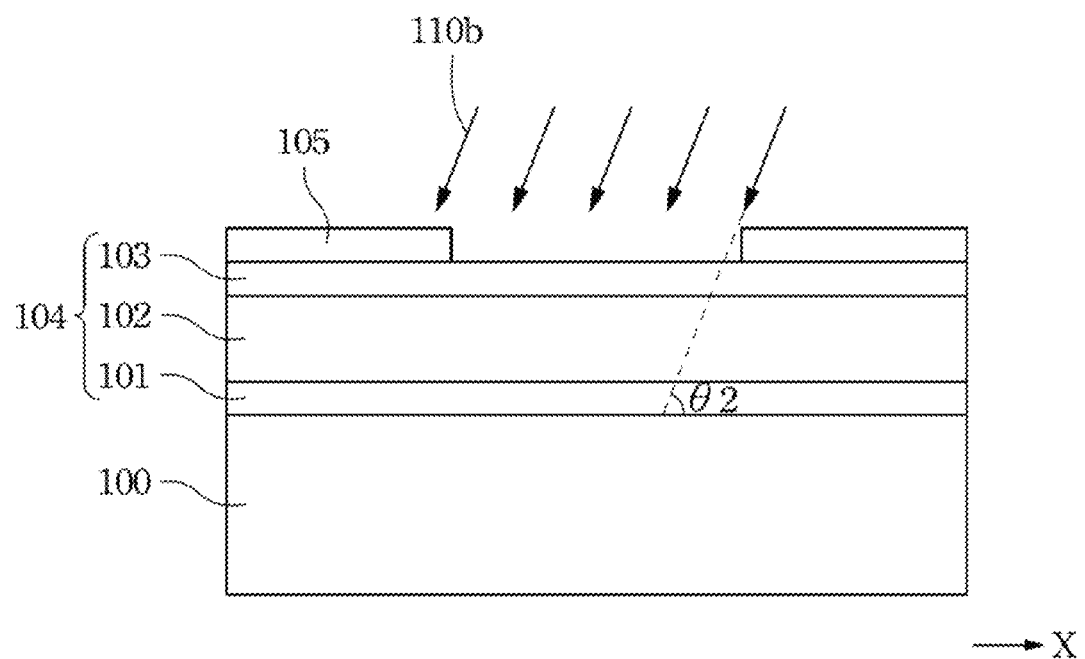

In FIG. 3, the metal layer 105 acts as a photomask for the following second angle exposures process. Second UV light 110b illuminates the tri-layer photoresist structure 104 to pattern the tri-layer photoresist structure 104. An included angle $\theta 2$ exists between the first UV light 110b and the substrate 100. The included angle $\theta 2$ can control the depressed depth of the second photoresist 102 relatively to the first photoresist layer 101 in the negative X direction. The included angle $\theta 2$ also decides an inclination angle $\alpha 2$ of a slant sidewall formed by the first photoresist layer 101 as illustrated in FIG. 4. In an embodiment, the included angle $\theta 2$ is between 25 degrees to 65 degrees. The first and the second angle exposures are applied from the opposite sides. For each exposure, only half of exposure-dose is applied.

In FIG. 4, the metal layer 105 is removed. In an embodiment, the metal layer 105 is removed by DHF before development. Then, the tri-layer photoresist structure 104 is developed. In an embodiment, the tri-layer photoresist structure 104 is PMMA/PMIPK/PMMA. The tri-layer photoresist structure 104 is developed using a mixture of MIBK:IPA of 1:3 with the assistance of ultrasonic variation, so as to expose the surface of the substrate 100. A descuming process is carried out by O2/Ar plasma, followed by a wet etching with HCl:water of 1:10. A T-shaped notch 107 is formed in the substrate as illustrated in FIG. 4. Two slant sidewalls with inclination angles $\alpha 1$ and $\alpha 2$ are formed by the first photoresist layer 101 to constitute a neck portion of a T-shaped gate. In an embodiment, a T-shaped gate includes two metal layers. The bottom metal layer is disposed between the slant sidewalls to form the neck portion. The top metal layer is disposed over the first photoresist layer 101. The width of the T-shaped notch 107 is gradually reduced from the top opening 107a to the opening 107b and exposes the surface of the substrate 100. The top opening 107a decides the gate resistance of the T-shaped gate. The opening 107b decides the gate length of the T-shaped gate.

Figure 5:
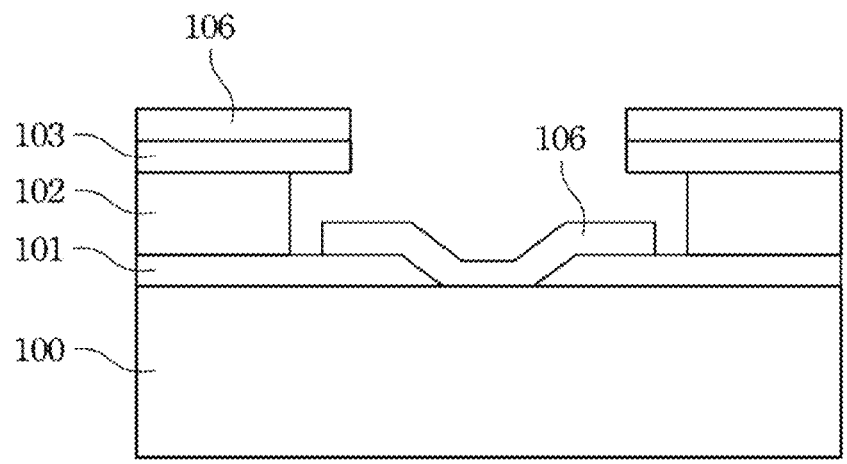
Figure 6:
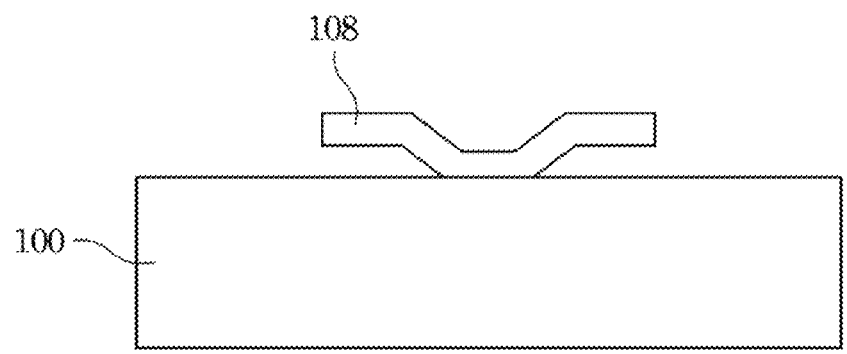

In FIG. 5, a gate metal 106 is deposited in the T-shaped notch 107 by electron beam evaporation. In an embodiment, the material forming the gate metal 106 is Ni/Au. In another embodiment, the material forming the gate metal 106 selected from the group consisting of Mo, W, Ti, Pt, or any combination of the above. Thereafter, in FIG. 6, lift-off process is performed to remove the tri-layer photoresist structure 104 and undesired metals to form the T-shaped gate 108. In an embodiment, the T-shaped gate 108 includes Ni/Au bilayers. The thickness of the Ni layer is 200 angstroms. The thickness of the Au layer is 3000 angstroms.

Figure 7:
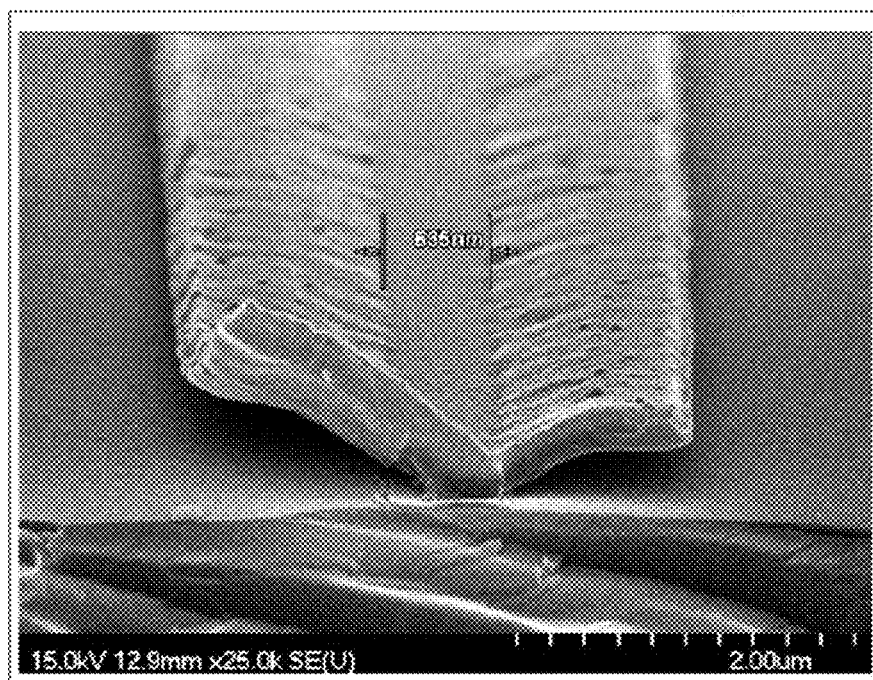
FIG. 7 is an Electron Microscopy image of a T-shaped gate according to an embodiment.

FIG. 7 is an Electron Microscopy image of a T-shaped gate according to an embodiment of the present invention. The gate length of the T-shaped gate is 0.6 um. The inclination angle of the neck portion is 30 degrees.

Accordingly, an angle exposure method is applied to a tri-layer photoresist structure with different development rates. Because of the different development rate of the tri-layer photoresist structure, a T-shaped notch is developed in the substrate after development process is performed. Then, gate metal is deposited in the T-shaped notch to form a T-shaped gate. Moreover, an improved top to bottom width ratio of the T-shaped gate can be also achieved by the angle exposure method.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for forming a T-shaped gate, the method comprising:
   providing a substrate;
   forming a photoresist structure over the substrate, wherein the photoresist structure includes two development rates;
   forming a mask over the photoresist structure, wherein the mask has an opening;
   using the mask to pattern the photoresist structure, further comprising:
      applying an angle exposure to the photoresist structure; and
      developing the photoresist structure exposed to form a T-shaped notch, wherein a width of the T-shaped notch is gradually reduced from a top portion thereof to a bottom portion thereof to expose a surface of the substrate;
   depositing gate metal in the T-shaped notch; and
   removing the patterned photoresist structure to form the T-shaped gate.

2. The method of claim 1, wherein a lift-off process is performed to remove the photoresist structure.

3. The method of claim 1, wherein height of the photoresist is 1 um.

4. The method of claim 1 wherein the width of the opening is 2 um.

5. The method of claim 1, wherein applying the angle exposure in the photoresist structure further comprises:
   applying a first angle exposure to the photoresist structure; and
   applying a second angle exposure to the photoresist structure, wherein the first angle exposure and the second angle exposure are applied from opposite sides.

6. The method of claim 5, wherein the first angle exposure and the second angle exposure are applied to the photoresist structure at an angle between 25 degrees to 65 degrees relative to the substrate.

7. The method of claim 1, wherein the mask is formed from Ti, NI, AU, Al or Cu.

8. The method of claim 1, wherein forming the photoresist structure over the substrate further comprises:

forming a first photoresist layer in the substrate;
forming a second photoresist layer over the first photoresist layer; and
forming a third photoresist layer over the second photoresist layer, wherein when being compared with the second photoresist layer, the first photoresist layer and the third photoresist layer have lower development rates.

9. The method of claim 8, wherein a material forming the first photoresist layer and the third photoresist layer is Polymethyl methacrylate (PMMA), and the material forming the second photoresist layer is Polymethyl isopropenyl ketone (PMIPK) or Copolymer.

10. The method of claim 1, wherein the T-shaped gate includes Ni/Au bilayers, and the thickness of the Ni layer is 200 angstroms, and the thickness of the Au layer is 3000 angstroms.

* * * * *